(12) United States Patent
Huang et al.

(10) Patent No.: US 9,899,661 B2
(45) Date of Patent: Feb. 20, 2018

(54) METHOD TO IMPROVE LICOO$_2$ MORPHOLOGY IN THIN FILM BATTERIES

(71) Applicant: Apple Inc., Cupertino, CA (US)

(72) Inventors: Lili Huang, San Jose, CA (US); Richard M. Mank, Cupertino, CA (US); Yanfeng Chen, San Ramon, CA (US)

(73) Assignee: Apple Inc., Cupertino, CA (US)

( * ) Notice: Subject to any disclaimer, the term of this patent is extended or adjusted under 35 U.S.C. 154(b) by 533 days.

(21) Appl. No.: 14/040,719

(22) Filed: Sep. 29, 2013

(65) Prior Publication Data
US 2014/0272560 A1 Sep. 18, 2014

Related U.S. Application Data

(60) Provisional application No. 61/780,169, filed on Mar. 13, 2013.

(51) Int. Cl.
*H01M 4/04* (2006.01)
*H01M 4/1391* (2010.01)
(Continued)

(52) U.S. Cl.
CPC ........... *H01M 4/0426* (2013.01); *C23C 14/08* (2013.01); *C23C 14/3492* (2013.01);
(Continued)

(58) Field of Classification Search
CPC .. H01M 4/0426; H01M 4/1391; H01M 4/366; H01M 4/525; H01M 4/0402;
(Continued)

(56) References Cited

U.S. PATENT DOCUMENTS

| 3,655,455 A | 4/1972 | Jones |
| 4,369,225 A | 1/1983 | Manabe et al. |
| (Continued) | | |

FOREIGN PATENT DOCUMENTS

| CN | 1144017 | 2/1997 |
| CN | 101640968 | 2/2010 |
| (Continued) | | |

OTHER PUBLICATIONS

Zhoghu et al (Layered Cathode Materials Li[NiLiMn]O for Lithium-Ion Batteries; Electrochemical and Solid-State Letters, 2001, A191-A194).*

(Continued)

*Primary Examiner* — Stephen Yanchuk
(74) *Attorney, Agent, or Firm* — Brownstein Hyatt Farber Schreck, LLP

(57) ABSTRACT

A method for improving the lithium cobalt oxide (LiCoO2) film (such as films in thin film batteries) morphology includes using oxygen (O2) and argon (Ar) gases during sputtering deposition of the LiCoO2 film. This may allow for the manufacturing of thicker LiCoO2 films. Such a method may also significantly reduce or eliminate cracking and obvious columnar structures within the resulting LiCoO2 film layer. Sputtering using a mixture of O2 and Ar also may produce a LiCoO2 film layer that requires lower annealing temperatures to reach good utilization and has higher lithium diffusion rates.

23 Claims, 13 Drawing Sheets

(51) Int. Cl.
  *H01M 4/36* (2006.01)
  *H01M 4/525* (2010.01)
  *C23C 14/08* (2006.01)
  *C23C 14/34* (2006.01)
  *H01M 10/052* (2010.01)

(52) U.S. Cl.
  CPC ......... *H01M 4/1391* (2013.01); *H01M 4/366* (2013.01); *H01M 4/525* (2013.01); *H01M 10/052* (2013.01)

(58) Field of Classification Search
  CPC .. H01M 4/0423; H01M 4/0438; H01M 4/044; H01M 4/045; H01M 4/0471; H01M 4/485; H01M 4/131; H01M 4/66; H01M 4/661; H01M 4/667; H01M 4/0404; H01M 10/052; H01M 10/0562; H01M 10/0472; H01M 10/0585; C23C 14/08; C23C 14/3492; C23C 14/35; Y02E 60/122
  See application file for complete search history.

(56) References Cited

U.S. PATENT DOCUMENTS

| | | | |
|---|---|---|---|
| 5,134,046 A | 7/1992 | Chow et al. | |
| 5,523,179 A | 6/1996 | Chu | |
| 5,554,459 A | 9/1996 | Gozdz et al. | |
| 5,561,004 A | 10/1996 | Bates et al. | |
| 6,001,138 A | 12/1999 | Dix | |
| 6,180,278 B1 | 1/2001 | Prickett | |
| 6,200,634 B1 | 3/2001 | Johnsgard et al. | |
| 6,319,631 B1 | 11/2001 | Bay et al. | |
| 6,410,189 B1 | 6/2002 | Yamada et al. | |
| 6,610,572 B1 | 8/2003 | Takei et al. | |
| 6,713,987 B2 | 3/2004 | Krasnov et al. | |
| 6,893,772 B2 | 5/2005 | Howard | |
| 7,585,582 B2 | 9/2009 | Chen | |
| 7,801,613 B2 | 9/2010 | Li et al. | |
| 7,927,744 B2 | 4/2011 | Mizutani et al. | |
| 7,931,989 B2 | 4/2011 | Klaassen | |
| 7,935,439 B2 | 5/2011 | Kim | |
| 7,939,195 B2 | 5/2011 | Salot et al. | |
| 7,960,054 B2 | 6/2011 | Zhang et al. | |
| 8,044,813 B1 | 10/2011 | Dembo | |
| 8,153,301 B2 | 4/2012 | Jiang | |
| 8,168,322 B2 | 5/2012 | Krasnov et al. | |
| 8,431,264 B2 | 4/2013 | Neudecker et al. | |
| 8,435,312 B2 | 5/2013 | Chen | |
| 8,445,130 B2 | 5/2013 | Neudecker et al. | |
| 8,518,583 B2 | 8/2013 | Mizuno et al. | |
| 8,669,345 B2 | 3/2014 | Lee et al. | |
| 8,679,674 B2 | 3/2014 | Liang et al. | |
| 8,822,059 B2 | 9/2014 | Wang | |
| 8,993,172 B2 | 3/2015 | Upadhyaya | |
| 9,209,451 B2 | 12/2015 | Fukushima | |
| 2001/0032666 A1* | 10/2001 | Jenson ................. A61N 1/3787 136/256 |
| 2003/0180621 A1 | 9/2003 | Matsumoto | |
| 2005/0079418 A1 | 4/2005 | Kelley et al. | |
| 2005/0153078 A1 | 7/2005 | Bentley et al. | |
| 2005/0250010 A1 | 11/2005 | Kurihara et al. | |
| 2006/0210880 A1 | 9/2006 | Howard et al. | |
| 2007/0125638 A1* | 6/2007 | Zhang .................... C23C 14/08 204/192.15 |
| 2008/0032236 A1 | 2/2008 | Wallace | |
| 2009/0181303 A1 | 7/2009 | Neudecker et al. | |
| 2009/0193649 A1 | 8/2009 | Niessen et al. | |
| 2009/0208754 A1 | 8/2009 | Chu et al. | |
| 2009/0214899 A1 | 8/2009 | Shakespeare et al. | |
| 2009/0317708 A1 | 12/2009 | Brandl et al. | |
| 2010/0035152 A1* | 2/2010 | Sastry ................... B82Y 30/00 429/218.1 |
| 2010/0066683 A1 | 3/2010 | Chang et al. | |
| 2011/0123844 A1 | 5/2011 | Bhardwaj et al. | |
| 2011/0129594 A1 | 6/2011 | Kwak et al. | |
| 2011/0177398 A1 | 7/2011 | Affinito et al. | |
| 2011/0183183 A1 | 7/2011 | Grady et al. | |
| 2011/0195271 A1 | 8/2011 | Zadesky et al. | |
| 2011/0200868 A1 | 8/2011 | Klaassen | |
| 2011/0294015 A1 | 12/2011 | Pirk et al. | |
| 2011/0311876 A1 | 12/2011 | Sturgeon et al. | |
| 2012/0078317 A1 | 3/2012 | Wang et al. | |
| 2012/0251867 A1 | 10/2012 | Krasnov et al. | |
| 2012/0270114 A1* | 10/2012 | Reynolds ............ H01M 4/0426 429/322 |
| 2013/0029205 A1 | 1/2013 | Adams | |
| 2013/0176654 A1 | 7/2013 | Wang et al. | |
| 2014/0007418 A1 | 1/2014 | Song | |
| 2014/0011067 A1 | 1/2014 | Baba et al. | |
| 2014/0147731 A1 | 5/2014 | Anastas et al. | |
| 2014/0147737 A1 | 5/2014 | Anastas et al. | |
| 2014/0147742 A1 | 5/2014 | Anastas et al. | |
| 2014/0264915 A1 | 9/2014 | Huang et al. | |
| 2014/0265915 A1 | 9/2014 | Huang et al. | |
| 2014/0272190 A1 | 9/2014 | Huang et al. | |
| 2014/0272541 A1 | 9/2014 | Huang et al. | |
| 2014/0272561 A1 | 9/2014 | Huang et al. | |
| 2014/0273890 A1 | 9/2014 | Huang et al. | |
| 2015/0325862 A1 | 11/2015 | Song et al. | |
| 2016/0064719 A1 | 3/2016 | Bushnell et al. | |
| 2016/0093837 A1 | 3/2016 | Bushnell et al. | |
| 2017/0309882 A1 | 10/2017 | Anastas et al. | |

FOREIGN PATENT DOCUMENTS

| | | |
|---|---|---|
| CN | 101676845 | 3/2010 |
| EP | 0792741 | 9/1997 |
| EP | 0975031 | 1/2000 |
| EP | 1804315 | 7/2007 |
| EP | 2105983 | 9/2009 |
| EP | 2481499 | 8/2012 |
| JP | 61032951 | 2/1986 |
| JP | 63314770 | 12/1988 |
| JP | 2013004173 | 1/2013 |
| JP | 2013021347 | 1/2013 |
| TW | I 306319 | 2/2009 |
| TW | 201010094 | 3/2010 |
| TW | 201014020 | 4/2010 |
| TW | 201108441 | 3/2011 |
| TW | 201218494 | 5/2012 |
| WO | WO 2008/007867 | 1/2008 |
| WO | WO 2010/033609 | 3/2010 |
| WO | WO 12/086557 | 6/2012 |
| WO | WO 2012/086557 | 6/2012 |
| WO | WO 2012/090929 | 7/2012 |
| WO | WO 2012/114162 | 8/2012 |

OTHER PUBLICATIONS

U.S. Appl. No. 14/040,581, filed Sep. 27, 2013, Huang et al.
U.S. Appl. No. 14/040,585, filed Sep. 27, 2013, Huang et al.
U.S. Appl. No. 14/040,592, filed Sep. 27, 2013, Huang et al.
U.S. Appl. No. 14/040,597, filed Sep. 27, 2013, Huang et al.
U.S. Appl. No. 14/041,059, filed Sep. 30, 2013, Huang et al.
U.S. Appl. No. 14/041,773, filed Sep. 30, 2013, Anastas et al.
U.S. Appl. No. 14/041,843, filed Sep. 30, 2013, Anastas et al.
U.S. Appl. No. 14/041,921, filed Sep. 30, 2013, Anastas et al.

* cited by examiner

METHOD TO IMPROVE LICOO₂ MORPHOLOGY IN THIN FILM BATTERIES

This application claims the benefit under 35 U.S.C. §119 (e) to U.S. Provisional Patent Application No. 61/780,169, filed Mar. 13, 2013, entitled "Method to Improve LiCoO₂ Morphology in Thin Film Batteries," the entirety of which is incorporated herein by reference as if fully cited herein

TECHNICAL FIELD

The present invention relates generally to batteries, and more specifically to the LiCoO2 film layer in lithium ion thin film batteries.

BACKGROUND

Many electronic devices, such as laptops, tablet computers, smartphones, and the like, use rechargeable batteries to provide power to one or more electronic components. A number of electronic devices use thin film batteries as the power source because of the many advantages it has over other batteries. For example, lithium ion thin film batteries which have a potential high energy density while maintaining a relatively compact configuration.

A lithium thin film battery's performance highly depends on the film of the cathode, among other layers. Current lithium thin film batteries available have a capacity of 2 mAh or less, which is often dictated by the thickness of the cathode file. In many batteries, a LiCoO2 cathode film has a thickness of 10 microns or thinner. One way to increase battery capacity, and thus increase the number of applications the battery can be used for, is to increase the thickness of the LiCoO2 film.

Many disadvantages are associated with thicker films. For example, thicker films may result in film cracking and undesirable crystal structures due to the required high deposition rate for thick films. Film cracking and/or undesirable crystal structure may cause low energy utilization and lithium diffusion rates, which may result in poor battery performance. Such disadvantages significantly limit the film thickness in lithium thin film batteries and consequently, confine the application of thin film batteries in electronic devices.

SUMMARY

Some embodiments described herein include methods for improving the LiCoO2 layer morphology in lithium thin film batteries. Sputtering methods using a mixture of argon (Ar) and oxygen (O2) gases may be used to deposit the LiCoO2 film layer. The LiCoO2 layer may then be annealed at a predetermined temperature to achieve the desired resulting film layer with generally no film cracking. The method also allows for producing thicker LiCoO2 film layers with very little or no film cracking and a desirable crystalline structure.

SPECIFICATION

Overview

In some embodiments, a thin film battery and method for improving the lithium cobalt oxide (LiCoO2) film morphology are disclosed. In some embodiments of the present disclosure, oxygen (O2) and argon (Ar) gases may be used during sputtering deposition of the LiCoO2 film which allows for the manufacturing of thicker LiCoO2 films. Such method may also significantly reduce or eliminate cracking and obvious columnar structures within the resulting LiCoO2 film layer. Sputtering using a mixture of O2 and Ar also produces a LiCoO2 film layer that requires lower annealing temperatures to reach good utilization and has higher lithium diffusion rates. These advantages will be further described in more detail below.

In some embodiments of the current disclosure, the LiCoO2 may be a multilayer film. The film may include alternating layers in which one layer is sputtered with Ar only, and another layer is sputtered with an Ar and O2 mixture.

In some embodiments, the LiCoO2 may be a multilayer film stack with film layers that alternate in composition. For example, in some embodiments, one layer may be a standard layer deposited with Ar only and using conventional sputtering methods, and a second layer may be have a different composition than the first. The two layers may alternate to form a multilayer stack.

The crystalline structure of the film, in some embodiments, may also be modulated by depositing a seed layer on a substrate, and subsequently depositing the LiCoO2 film layer. The seed layer may facilitate in producing a LiCoO2 film layer having a desirable crystalline structure.

In some embodiments, a substrate with a designed texture surface may be used. The LiCoO2 may be deposited on the substrate having a designed texture surface which may assist in the a desired crystalline structure of the LiCoO2 film.

The film morphology and microcrystalline structure may, in some embodiments, be modulated by having a multilayer structure with the layers being prepared with substrates under different process conditions.

DETAILED DESCRIPTION

Figure 1:
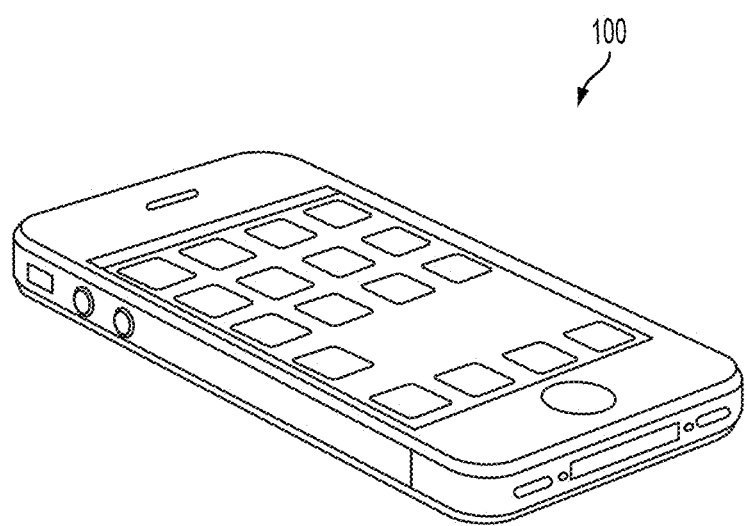
FIG. 1 is a perspective view of an electronic device incorporating the thin film battery.
Figure 2:
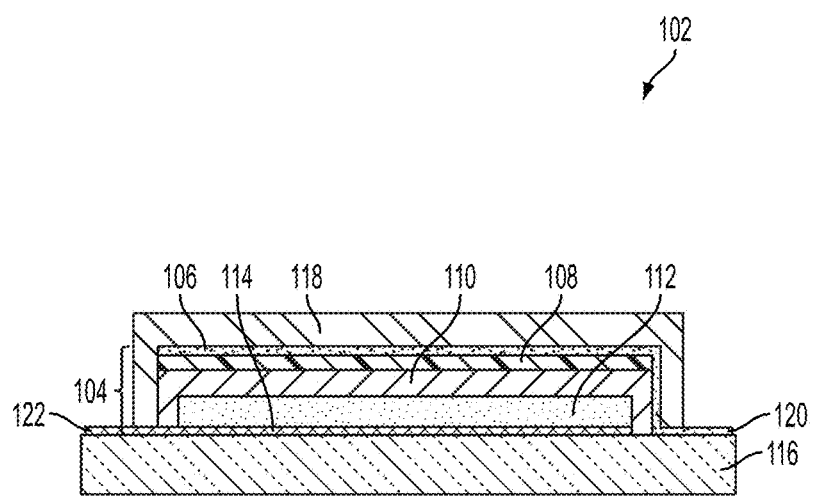
FIG. 2 is a cross-sectional view of the stacked layers within a battery device.

Turning to the figures, an illustrative lithium ion battery will be discussed in further detail. FIG. 1 is an illustrative electronic device 100 incorporating one or more batteries 102 (shown in FIG. 2). Although the illustrative electronic device 100 in FIG. 1, FIG. 2 illustrates a cross-sectional view of the thin film battery 102 with a battery core 104 having a stacked layer configuration. The battery core 104 can have an anode current collector layer 106, an anode layer 108, an electrolyte 110, a cathode layer 112, a cathode current collector layer 114, and a substrate 116. The battery 102 may further include an encapsulation 118 or housing around the battery core 104 to provide some protection and structure for the battery 102. It should be noted that although the battery 102 is illustrated in FIG. 2 as being generally rectangular, many other dimensions and shapes are envisioned, such as but not limited to, geometric, non-geometric, or the like.

A positive terminal 122 and a negative terminal 120 may extend through the encapsulation 118, or may otherwise be configured such that the terminals 120, 122 are in communication with the battery core 104 and with one or more external components (e.g., components of the electronic devices 100). The terminals 120, 122 may transfer current from the battery core 104 to one or more components of the electronic device 100 and also may transfer current to the battery core 104 from an external power source (e.g., charging the battery 102).

The cathode current collector 114 may be in communication with the positive terminal 122, and the anode current collector 106 may be in communication with the negative terminal 124. The cathode current collector 114 and anode current collector 106 may be made from a material that has a high electric conductivity (low resistivity), corrosion resistant, and is stable at high temperatures (i.e., no alloy formation at high temperatures, such as at 700° C.). The cathode current collector 114 may be positioned on a substrate 116, or otherwise may form the substrate and base on which the cathode layer 112 can be positioned.

Sputtering with O2 and Ar

A method of manufacturing the film layer (e.g., cathode layer 112) will now be discussed in further detail. In some embodiments, a thicker LiCoO2 film may be produced using a method of sputtering deposition using a well-controlled amount of O2 mixed with Ar. Conventional sputtering methods for manufacturing a LiCoO2 film layer use only Ar to deposit the LiCoO2. Using only Ar, however, may create film cracking and distinct columnar structures after annealing, particularly when manufacturing thicker films. Mixing O2 with Ar during the sputtering process allows for the production of a thicker LiCoO2 while also resulting in a better film morphology and battery performance which will be discussed in further detail below.

Using O2 may affect the sputtering plasma ionization, sputter rates, and film nucleation and growth. In some embodiments, the amount of O2 compared to Ar may vary based on the battery design and desired crystallization structure. For example, the amount of O2 mixed with the Ar may be enough to achieve a LiCoO2 with a better morphology without causing the film to be lithium (Li) deficient.

Figure 3A:
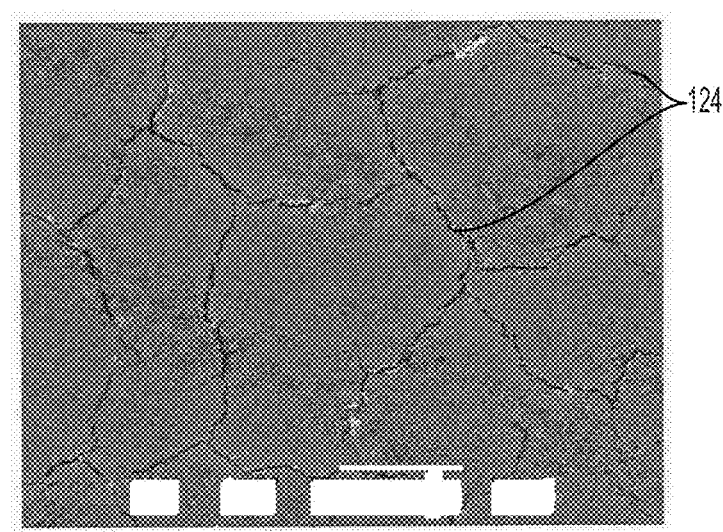
FIG. 3A is an exemplary top view of a thin film layer deposited with Ar only.
Figure 3B:
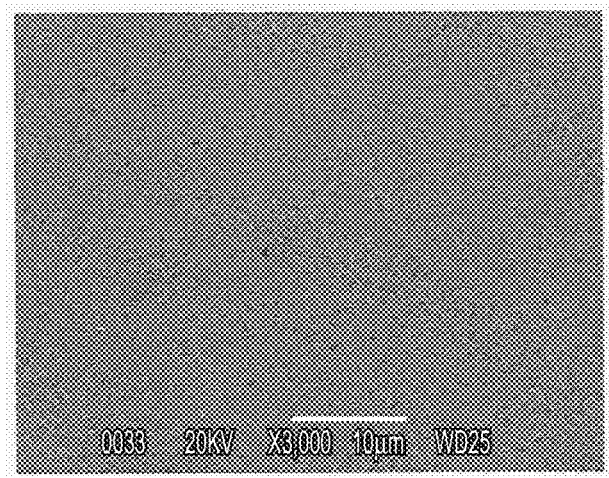
FIG. 3B is an exemplary top view of a thin film layer deposited with a mixture of Ar and O2.

The advantages to manufacturing the LiCoO2 film with a mixture of Ar and O2 will now be discussed. First, depositing LiCoO2 with a mixture of O2 and Ar may eliminate film cracking. FIG. 3A illustrates an exemplary film layer in which LiCoO2 was deposited with only Ar. In contrast, FIG. 3B illustrates the same film in which LiCoO2 was deposited with Ar mixed with O2. As shown in FIG. 3A, using only Ar produces film cracking as evident by cracks 124.

Figure 4A:
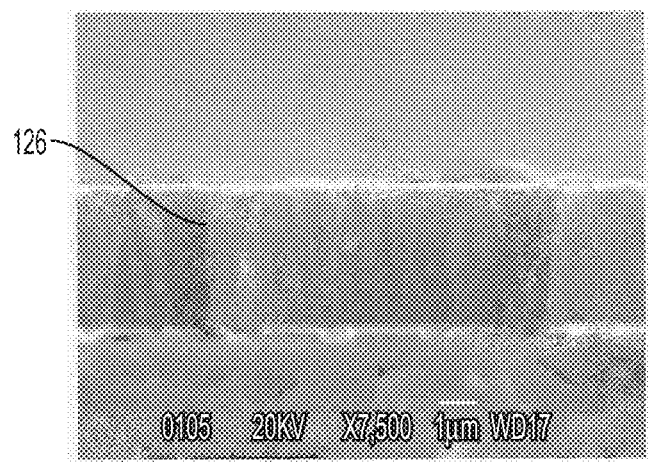
FIG. 4A is an exemplary cross-sectional view of a thin film layer deposited with Ar only.
Figure 4B:
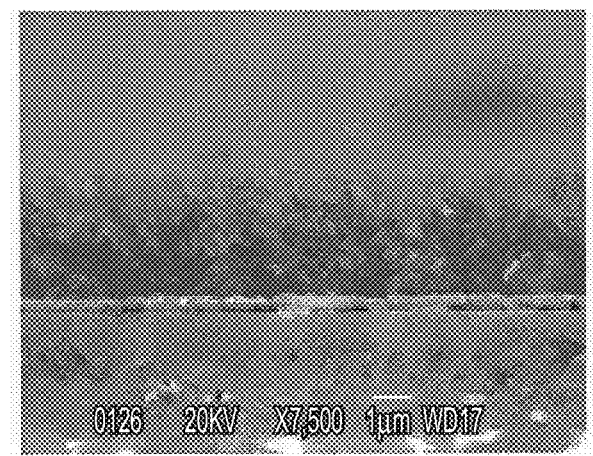
FIG. 4B is an exemplary cross-sectional view of a thin film layer deposited with a mixture of Ar and O2.

Second, depositing the LiCoO2 film with a mixture of Ar and O2 may also eliminate columnar structures within the film. FIG. 4A illustrates an exemplary film layer having distinct columnar structures 126. Such columnar structures 126 may be susceptible to cracking which limits lithium diffusion. The columnar structures 126 may also result in a film having a lower density which limits lithium utilization. FIG. 4B illustrates the same film in which LiCoO2 was deposited with Ar mixed with O2. When LiCoO2 is deposited with a mixture of Ar and O2, the columnar structures 126 may be eliminated, and thus, a denser film structure having increased Li diffusion rates and increased Li utilization may be achieved after annealing.

Figure 5A:
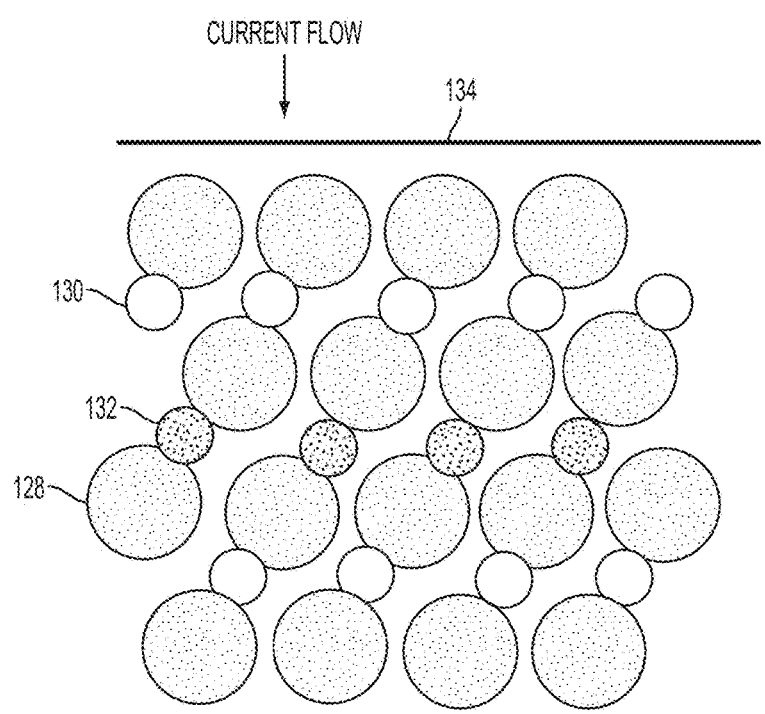
FIG. 5A is a simplified view of a (003) crystallized structure.
Figure 5B:
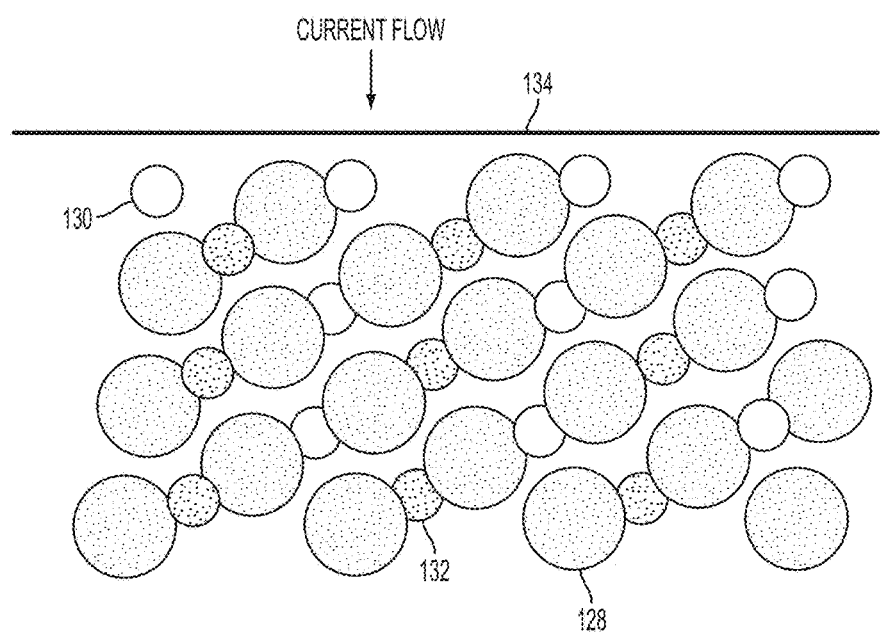
FIG. 5B is a simplified view of a (101) crystallized structure.
Figure 5C:
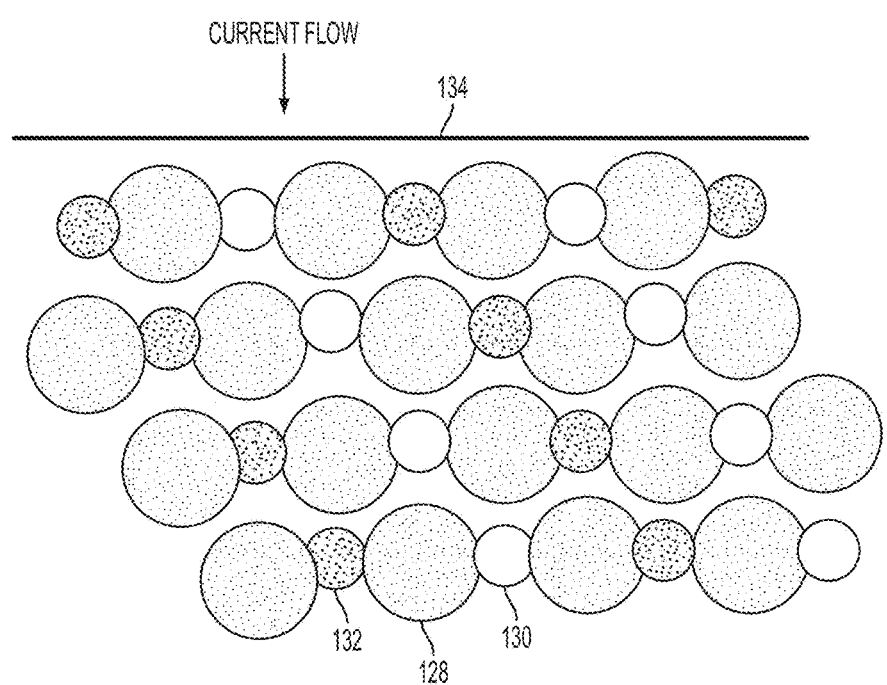
FIG. 5C is a simplified view of a (104) crystallized structure.

In some embodiments, sputtering the LiCoO2 with a mixture of Ar and O2 may also produce a more desirable crystal structure. Typically, LiCoO2 exhibits four types of crystallization structures: (003), (102), (101), and (104). FIGS. 5A-5C illustrate exemplary crystallization structures of (003), (101), and (104) of LiCoO2 having O2 128, Li 130, and Co 132.

Using conventional methods of film sputtering with only Ar typically results in (003) and (102) crystallization structures. The planes of a (003) crystallization structure are generally parallel to the substrate or film surface 134. The Li layer is shown as 130 is parallel to the film surface 134. This structure may increase the difficulty of the Li ions diffusing through the film surface 134, thereby resulting in a slower diffusion rate. The Li ions instead rely on grain boundary diffusion in (003) crystallization structures. After annealing, the (003) and (102) structure may transition to a (101) crystallization structure, but not a (104) structure, the preferred structure, even after annealing at high temperatures (such as at approximately 700° C.).

In contrast, sputtering with a mix of O2 and Ar may result in a denser film with a preferred (104) structure after annealing. A (104) crystallization structure is most preferred structure because the predominant phase of a (104) crystallization structure has planes parallel to the film surface 134. In addition, the (104) crystallization structure has open channels for the Li ions to diffuse to the film surface 134, has lower resistance, and has a better rate capability during discharge. Because Li ions may be used to carry charge, the open channels may provide for lower impedance compared to a film layer sputtered with only Ar, and thus, may provide for a higher lithium ion diffusion rate. Sputtering with a mix of O2 and Ar may also result in a structure with a Li diffusion coefficient of LiCoO2 that is higher than sputtering with only Ar.

Further, less stringent annealing is required with a LiCoO2 film deposited with the Ar and O2 mixture as described herein. To reach an acceptable utilization, lower temperatures are required with film deposited with the O2 and Ar mixture compared to film deposited with Ar only. For example, film deposited with Ar may require 600° C. to 700° C. or higher to reach acceptable utilization. In contrast, to achieve a generally equivalent utilization, a LiCoO2 film deposited with a mixture of Ar and O2 may be annealed at much lower temperature (e.g., at least approximately 300° C.). Less astringent annealing (e.g., annealing at a lower temperature) may also allow for a larger substrate selection and a reduction to the cost of product. For example, lower annealing temperature may allow for cheaper substrates, such as polymer substrates, which may be more economical.

Figure 6:
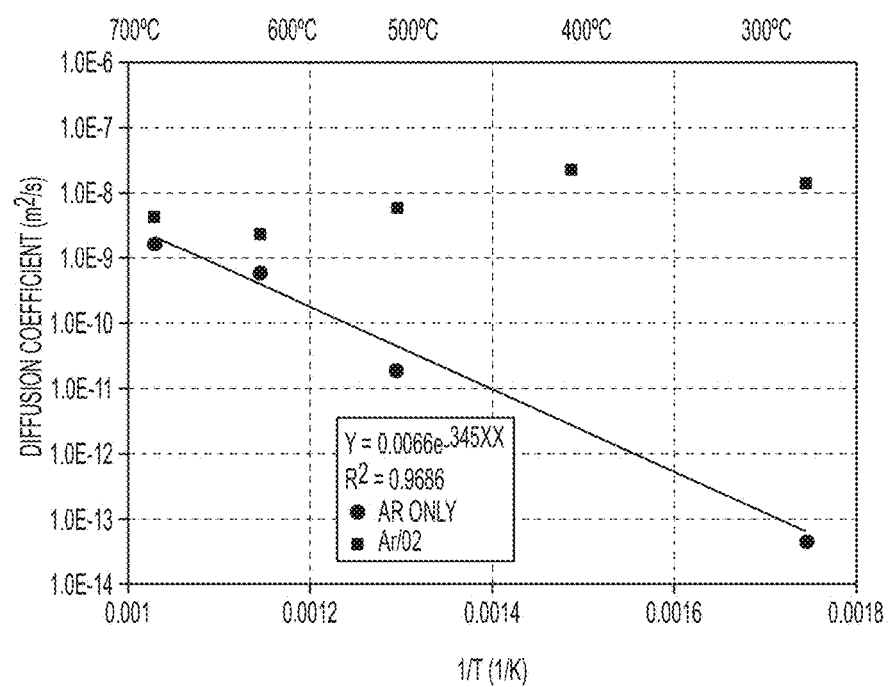
FIG. 6 is an illustrative chart of results from exemplary testing of annealing temperatures conducted on a film layer deposited with Ar only and a film layer deposited with a mixture of Ar and O2.

Exemplary testing have been conducted that compared annealing temperatures of a film deposited with Ar only and with a mixture of Ar and O2. As shown in the illustrative chart of FIG. 6, results from the exemplary testing showed that there is a large difference between the diffusion coefficient of film deposited with only Ar and film deposited with a mixture of Ar and O2. For example, at 300° C., 400° C., and 500° C. annealing temperatures, the diffusion coefficient of the Ar and O2 mixture is much higher than that of the film deposited with only Ar.

Thus, film deposited with a mixture of Ar and O2 not only allows for annealing at lower temperatures, but may also provide for higher utilization at lower temperatures and higher Li diffusion rates which may lead to better battery performance and may reduce the cost of producing the battery 102.

Multilayer Film with Alternating Ar and Ar/O2 Sputter

Figure 7:
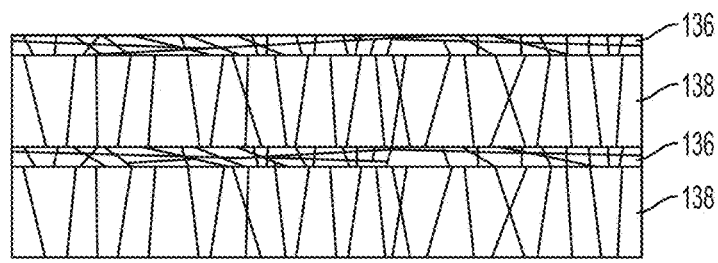
FIG. 7 is a simplified cross-sectional view of a multilayer thin film with alternating layers in some exemplary embodiments.

In some embodiments, the film may be a multilayer film stack that may prevent crack propagation. A multilayer film stack may be beneficial for tall structures, which may be more susceptible to cracking than shorter structures. The LiCoO2, in some embodiments, may be deposited using alternating methods, and subsequently, the multilayer film stack may be composed of different layers. FIG. 7 illustrates an exemplary multilayer film stack with a first film layer 138 deposited with only Ar, which has a high deposition rate and cracks, and a second film layer 136 deposited with a mixture of Ar and O2, which has a low deposition rate and no cracks. The cracks in the film layer 138 deposited with Ar only may be eliminated by the film layer 136 deposited with the mixture of Ar and O2. Additionally, in some embodiments, the multilayer film may be configured such that the film layer 136 deposited with Ar and O2 occupies only a small portion of the multilayer film compared to the film layer 138 deposited with Ar only. Such configuration may maintain the high average deposition rate and also significant reduces or eliminates crack propagation. It should be noted that the multilayer film with alternating Ar film layer 138 and Ar and O2 film layer 136 may be combined with other embodiments described herein. Although FIG. 7 illustrates a four layer stack, it is appreciated that the number of layers and the order in which the layers are deposited with respect to each other may vary depending on the design of the battery.

Multilayer Film with Alternating Composition

Figure 8:
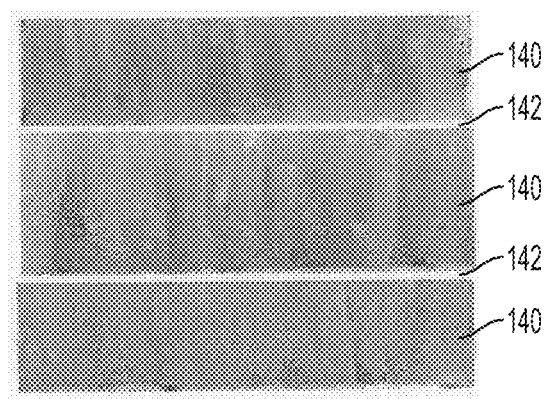
FIG. 8 is a cross-sectional view of a multilayer thin film with alternating layers in another embodiment.

Another method of manufacturing the LiCoO2 film layer will now be described. In some embodiments, the film layer may be a multilayer film with layers having alternating composition. The deposition of the multilayer film may be done in a multistep process. For example, FIG. 8 illustrates an exemplary multilayer film with a standard layer 140 and an alternative film layer 142. Although FIG. 8 depicts a six layer film, it is appreciated that the number of layers, the number of different layer types, and the order in which the layers are deposited with respect to each other may vary depending on the design of the battery.

Figure 9:
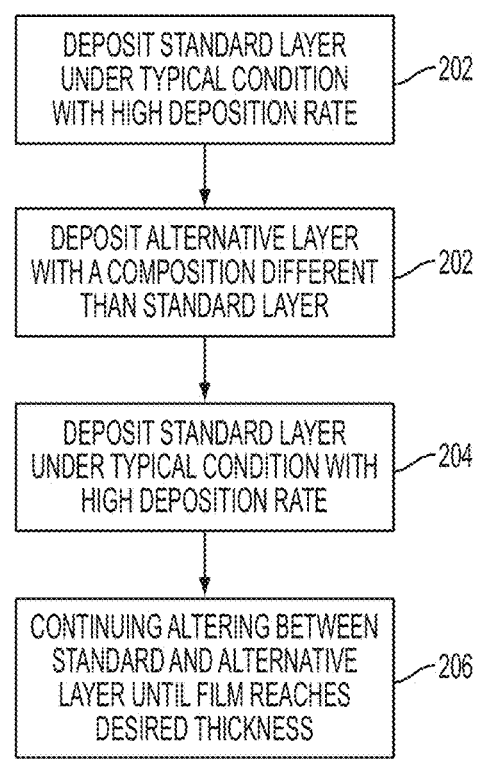
FIG. 9 is a simplified flow diagram of a method of manufacturing the multilayer thin film of FIG. 8.

FIG. 9 is an illustrative flow chart of the method for manufacturing the multilayer film with an alternating composition. A film may first be deposited with a standard layer 140 using conventional sputtering methods under typical conditions with a high deposition rate (such as depositing with Ar only) (step 200 of FIG. 9). In some embodiments, the thickness of the standard layer 140 may be maintained at a level where no cracking occurs. An alternative layer 142 may be deposited on the standard layer 140 having a different composition (step 202 of FIG. 9). This different composition may be a material by design that enhances film performance such as a Li-rich, O2-rich, or pure Li layer. The thickness of this layer 142 may be less than the thickness of the standard layer 140. Another standard layer 140 may be deposited on the alternative layer 142 under typical conditions with a high deposition rate (such as with Ar) (step 204 of FIG. 9). This alternative layering process may continue until a desired thickness is reached (step 206 of FIG. 9).

Typically, the higher the deposition rate, the poorer the film quality. The method of manufacturing a multilayer film with alternating composition as described herein provides for a film where a majority of the film may have a high deposition rate (e.g., the standard layer 140) but still maintains a good film quality (such a stable film). The multilayer film with alternating composition as described herein may also be more stable because it may disrupt the continuous columnar structures that may appear in the standard layer 140. The columnar structures may be susceptible to cracking which results in slowing or terminating Li ion diffusion. Additionally, because of the alternative layer 142, the multilayer film may have improved cathode utilization, better mechanical properties, lower resistance, and/or better discharge or charge performance.

It should be noted that the multilayer film with alternating composition may be combined with other embodiments described herein.

Substrate with a Seed Layer

In some embodiments, the thin film crystalline structure may be modulated by first depositing a seed layer on a substrate. The seed layer may be sputter deposited evaporated, wet coated, printed on, or other suitable methods. The LiCoO2 may be deposited on the seeded layer, and the seeded layer may assist with modulating the LiCoO2 film layer to have a desired crystalline structure. It should be noted that having a substrate with a seed layer may be combined with other embodiments described herein.

Substrate with a Designed Texture

Another method of modifying the thin film crystalline structure will now be described. The thin film crystalline structure may be modulated by making a desired texture on the substrate. The texture may be made by wet etching, sputter etching, mechanical roughing, or other suitable ways during the manufacturing of the substrate. The LiCoO2 may then be deposited on the texture, and the textured surface may assist with modulating the crystalline structure of the LiCoO2 film layer. For example, the texture may prevent straight columnar structures in the film layer. Additionally, the textured surface may improve adhesion of the film layer, particularly in thick films, because of the increased surface area of the substrate. It should be noted that having a substrate with a designed texture may be combined with other embodiments described herein.

Multilayer Film with Alternating Process Condition

In some embodiments, the film morphology and microcrystalline structure may be modulated by having a multilayer structure in which the layers are prepared under different process conditions. For example, the film layers may be prepared with different substrate temperature, bias (e.g., a power supply with a predetermined voltage being applied to the substrate), or process gas pressure. Having a film with selected layers prepared under different processes may prevent voids or crack formation through the film stack during film depositions.

It should be noted that this method may be combined with other embodiments described herein.

Conclusion

The foregoing description has broad application. For example, while examples disclosed herein may focus on discrete embodiments, it should be appreciated that the concepts disclosed herein may be combined together and implemented in a single structure. Additionally, although the various embodiments may be discussed with respect to improving LiCoO2 morphology in thin film batteries found in smartphones, the techniques and structures may be implemented in any type of electronic devices using thin film lithium ion batteries. Accordingly, the discussion of any embodiment is meant only to be an example and is not intended to suggest that the scope of the disclosure, including the claims, is limited to these examples.

What is claimed is:

1. A method for creating a lithium cobalt oxide (LiCoO2) film layer in a battery core, comprising:
depositing a LiCoO2 film layer by sputtering LiCoO2 with a sputtering gas, wherein the sputtering gas is a mixture of oxygen and argon;
annealing the LiCoO2 film layer at a predetermined temperature to achieve a resulting LiCoO2 film; and
depositing another LiCoO2 film layer on the annealed LiCoO2 film layer by sputtering LiCoO2 with an additional gas that includes argon, but not oxygen; wherein
the other LiCoO2 film layer is thinner than, and strengthens, the annealed LiCoO2 film layer.

2. The method of claim 1, wherein the predetermined temperature is at least 300° C.

3. The method of claim 1, wherein the LiCoO2 film layer is deposited on a substrate surface having a textured design such that the textured design on the surface facilitates a desired crystallized structure of the resulting LiCoO2 film.

4. The method of claim 3, wherein the textured design is formed on the substrate surface by at least one of we etching, sputter etching, or mechanical roughing.

5. The method of claim 1, wherein the LiCoO2 film layer is deposited on a substrate surface having a seed layer such that the seed layer facilitates a desired crystallized structure of the resulting LiCoO2 film.

6. The method of claim 5, wherein the seed layer is at least one of sputter deposit evaporated onto the substrate surface, wet coated onto the substrate surface, or printed onto the substrate surface.

7. The method of claim 1, wherein annealing the LiCoO2 film layer at the predetermined temperature achieves a crystallization structure of the resulting LiCoO2 film that has planes parallel to a surface of the resulting LiCoO2 film and open channels for lithium ions to diffuse to the surface of the resulting LiCoO2 film.

8. A method of creating a multiple layer lithium cobalt oxide (LiCoO2) film in a battery core, comprising:
depositing a first LiCoO2 film layer by sputtering LiCoO2 with a sputtering gas, wherein the sputtering gas is a mixture of oxygen and argon; and
annealing the first LiCoO2 film layer at a predetermined temperature to achieve a resulting LiCoO2 film; and
depositing a second LiCoO2 film layer on the annealed first LiCoO2 film layer by sputtering LiCoO2 with a second sputtering gas that includes argon and lacks oxygen; wherein
the second LiCoO2 film layer disrupts continuous columnar structures in the annealed first LiCoO2 film layer.

9. The method of claim 8, further comprising
depositing a third LiCoO2 film layer of on the second LiCoO2 film layer by sputtering LiCoO2 with the sputtering gas; and
annealing the third LiCoO2 film layer at the predetermined temperature.

10. The method of claim 9, further comprising depositing additional film layers by alternating sputtering layers with the argon gas and the sputtering gas.

11. The method of claim 10, wherein a first of the additional film layers deposited on the third LiCoO2 film layer is sputtered with the argon gas.

12. The method of claim 8, wherein the predetermined temperature is at least 300° C.

13. The method of claim 8, wherein the first LiCoO2 film layer is deposited on a substrate surface having a textured design such that the textured design on the surface facilitates a desired crystallized structure of the resulting LiCoO2 film.

14. The method of claim 13, wherein the textured design is formed on the substrate surface by at least one of we etching, sputter etching, or mechanical roughing.

15. The method of claim 8, wherein the first LiCoO2 film layer is deposited on a substrate surface having a seed layer such that the seed layer facilitates a desired crystallized structure of the resulting LiCoO2 film.

16. The method of claim 15, wherein the seed layer is at least one of sputter deposit evaporated onto the substrate surface, wet coated onto the substrate surface, or printed onto the substrate surface.

17. The method of claim 8, wherein annealing the first LiCoO2 film layer at the predetermined temperature achieves a crystallization structure of the resulting LiCoO2 film that has planes parallel to a surface of the resulting LiCoO2 film and open channels for lithium ions to diffuse to the surface of the resulting LiCoO2 film.

18. The method of claim 8, wherein the first LiCoO2 film layer and the second LiCoO2 film layer are deposited under at least one of different substrate temperatures, biases, or process gas pressures.

19. The method of claim 8, wherein the first LiCoO2 film layer is thinner than the second LiCoO2 film layer.

20. A method for creating a lithium cobalt oxide (LiCoO2) film layer in a battery core, comprising:
depositing a LiCoO2 film layer on a substrate using a process including a mixture of oxygen and argon;
heating the LiCoO2 film layer to a temperature of less than 500 degrees Centigrade to anneal the LiCoO2 film layer;
depositing an additional LiCoO2 film layer on the annealed LiCoO2 film layer using an additional process including only argon as a sputtering gas; and
depositing a third LiCoO2 film layer on the additional LiCoO2 film layer using the process including the mixture of oxygen and argon.

21. The method of claim 20, further comprising depositing a film layer on the third LiCoO2 film layer having a different composition than the third LiCoO2 film layer.

22. The method of claim 21, wherein the film layer is one of:
a Li-rich layer;
a O2-rich layer; or
a pure Li layer.

23. The method of claim 21, further comprising depositing a fourth LiCoO2 film layer on the film layer.

* * * * *